US005457299A

United States Patent [19]
Blais et al.

[11] Patent Number: 5,457,299
[45] Date of Patent: Oct. 10, 1995

[54] SEMICONDUCTOR CHIP PACKAGING METHOD WHICH HEAT CURES AN ENCAPSULANT DEPOSITED ON A CHIP USING A LASER BEAM TO HEAT THE BACK SIDE OF THE CHIP

[75] Inventors: Claude Blais, Granby, Canada; Pedro A. Chalco, Yorktown Heights, N.Y.

[73] Assignee: International Business Machines Corporation, Armonk, N.Y.

[21] Appl. No.: 144,948

[22] Filed: Oct. 29, 1993

[51] Int. Cl.⁶ .................................................. B23K 26/00
[52] U.S. Cl. .................. 219/121.85; 219/121.66; 219/121.6; 437/173; 437/224; 437/219
[58] Field of Search .................... 219/121.85, 121.65, 219/121.66, 121.6; 437/207, 219, 217, 224, 173, 174

[56] References Cited

U.S. PATENT DOCUMENTS

| H445 | 3/1988 | Bock et al. | 264/1.7 |
|---|---|---|---|
| 3,764,772 | 10/1973 | Matuschek | 219/85 |
| 3,900,593 | 8/1975 | Herczog et al. | 427/53 |
| 4,203,792 | 5/1980 | Thompson | 156/272 |
| 4,286,250 | 8/1981 | Sacchetti | 338/306 |
| 4,404,453 | 9/1983 | Gotman | 219/121 LD |
| 4,676,586 | 6/1987 | Jones et al. | 350/96.20 |
| 4,909,428 | 3/1990 | Mermet-Guyennet | 228/6.2 |
| 5,219,786 | 6/1993 | Noguchi | 437/174 |

FOREIGN PATENT DOCUMENTS

| 0212889 | 12/1983 | Japan . |
|---|---|---|
| 0027866 | 2/1991 | Japan . |
| 4249512 | 9/1992 | Japan . |

Primary Examiner—Mark H. Paschall
Attorney, Agent, or Firm—Stephen C. Kaufman; Ronald L. Drumheller

[57] ABSTRACT

A method for encapsulating a semiconductor chip. The method includes the steps of first positioning a chip over a laser-curing cavity, and then dispensing a predetermined amount of encapsulant over the chip. Sequential steps include synchronizing a firing of a laser pulse immediately after the dispensing step, and curing the encapsulant by conducting heat generated by the laser pulse, through the chip.

8 Claims, 1 Drawing Sheet

SEMICONDUCTOR CHIP PACKAGING METHOD WHICH HEAT CURES AN ENCAPSULANT DEPOSITED ON A CHIP USING A LASER BEAM TO HEAT THE BACK SIDE OF THE CHIP

FIELD OF THE INVENTION

This invention relates to a method for encapsulating a semiconductor chip.

INTRODUCTION TO THE INVENTION

We are working on an important process that subsumes encapsulating a semiconductor chip. This process is generally known as tape automated bonding (TAB) of chips, and includes the following steps.

First, in TAB processing technology, semiconductor chips are typically attached to a carrier tape, in a continuous reel-to-reel automated process. Then, on a second tool, an active surface of a chip is typically encapsulated within a dome of a polymer encapsulant, and gelled in a continuous process. Third, the reel of tape is next placed into a convection oven, to complete a cure cycle of the encapsulant. Conventional heaters such as convection with resistive elements or infra-red radiation, are normally used for the gel operation.

SUMMARY OF THE INVENTION

In order to optimize, enhance and expand the TAB processing technology, we are critically analyzing, inter alia, the methodology surrounding the cure cycle of the encapsulant.

Here, we first note that the conventional heaters comprising resistive elements or infra-red radiation, are usually capable of handling medium to large-size surfaces only, and therefore cannot be effectively used to concentrate the heating on a very small point (e.g., less than 2 mm). However, we are working with small semiconductor chips that are typically less than 2 mm.

Second, we have observed that the encapsulation of small chips (less than 2 mm) compared to larger chips, may be more difficult using conventional heaters because of a different ratio in thickness-to-surface area. Thus, during a gel stage, viscosity drops because of the heat, and then increases with the polymerization. Accordingly, the heat-transfer must be high enough to gel the metal on a chip, before it spills over, and focused on the chip to minimize a wicking along the chip leads. We have determined that the gel time must not take more than a few seconds to keep the encapsulator with an acceptable throughput rate.

We have now discovered a novel method for encapsulating a semiconductor chip. The novel method is based on heating a semiconductor chip with a laser pulse, the pulse preferably delivered and directed through an optical fiber. The novel method comprises the steps of:

a) positioning a chip over a laser-curing cavity;

b) dispensing a predetermined amount of encapsulant over the chip;

c) synchronizing a firing of a laser pulse immediately after the dispensing step (b); and d) curing the encapsulant by conducting heat generated by the laser pulse, through the chip.

The novel method as defined can realize important advantages. It can provide a fast and reliable gel-curing method for encapsulating small TAB chips, for example, chips less than 2 mm. Further, the novel method can substantially (advantageously) reduce the space needed to accommodate hardware that is needed for curing. Additionally, the novel method enhances the extant TAB process, and can therefore provide laser heating with automation, high production rates, and low curing defect levels.

BRIEF DESCRIPTION OF THE DRAWING

The invention is illustrated in the accompanying drawing, in which FIG. 1 provides a schematic diagram of laser curing of gel used in an encapsulation of a semiconductor chip attached to a Tape Automated Bonding (TAB) carrier.

DETAILED DESCRIPTION OF THE INVENTION

Figure 1:
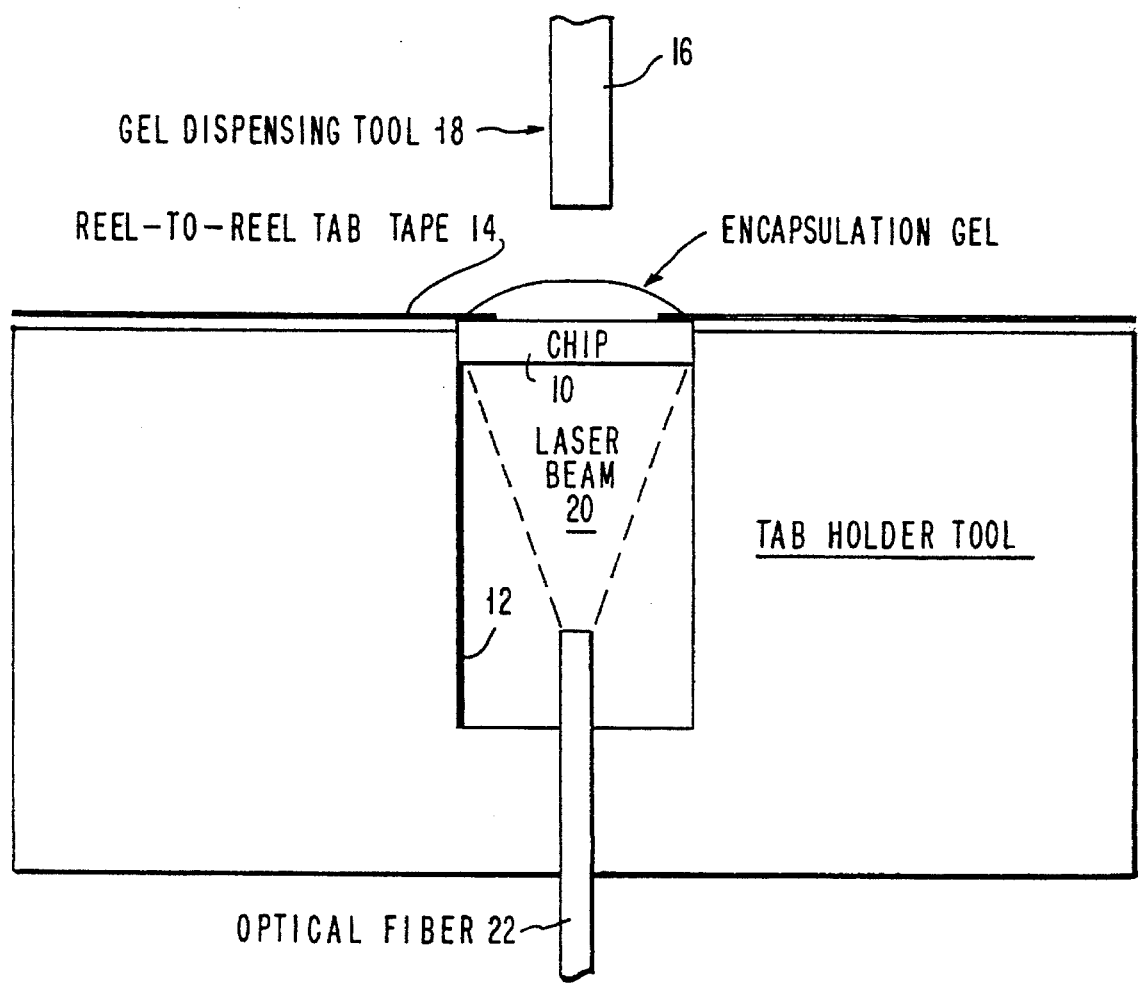

Attention is now directed to FIG. 1, which may be used to illustrate various preferred aspects of the present invention.

In particular, FIG. 1 shows a method for encapsulating a conventional semiconductor chip 10, the chip preferably having a size less than 2 mm.

The semiconductor chip 10 is first positioned in place over a conventional laser-curing cavity 12, preferably by way of an automatic advancement of the semiconductor chip 10, as attached to a TAB tape 14.

A predetermined amount of an encapsulant 16 is preferably dispensed over the semiconductor chip 10 by way of a conventional gel dispensing tool 18. For example, a preferred encapsulant 16 may comprise a conventional epoxy like Epotek H-62, and is preferably uniformly dispensed over the semiconductor chip 10 by employment of a conventional encapsulating dispensing mechanism.

Preferably, a laser pulse is synchronized to fire immediately after the dispenser deposits a drop of the encapsulant over the semiconductor chip 10. For example, a laser pulse duration preferably may be controlled by an intra-cavity shutter which may be synchronized to open immediately after the dispenser action.

The present method preferably incorporates an arrangement comprising heating the semiconductor chip 10 with a laser pulse 20 delivered and directed through an optical fiber 22. Preferably, the heating setup is reduced to simply fitting a 0.2 mm glass fiber a few millimeters below the semiconductor chip 10, as shown in FIG. 1. An emitting end of the optical fiber 22 preferably is fixed in a holder which is at close proximity to the back side of the semiconductor chip 10. A distance between the optical fiber end and the semiconductor chip 10, is dictated by a numerical aperture of the optical fiber, and a size of the semiconductor chip 10.

For our method, a suitable laser comprises a neodymium-yttrium aluminum garnet laser which has a wavelength in the near infra-red, and is preferably operated in the CW mode, although it may be operated in a pulsed mode. Other suitable solid state lasers are the ruby laser with a wavelength of 680 nanometers, or an alexandite laser with a wavelength of 630–730 nanometers, both in the visible spectrum, or a conventional diode laser with a wavelength between 800 to 1000 nanometers.

Curing of the encapsulant is typically achieved in a period of a few seconds by laser heating conducted through the semiconductor chip 10. For example, the semiconductor chip 10 typically achieves 400 C in a period of one to two seconds. Following curing, a second chip may be advanced in place, and a curing operation repeated.

What is claimed:

1. A method for encapsulating a semiconductor chip, comprising the steps of:
   a) positioning a chip over a laser-curing cavity;
   b) dispensing a predetermined amount of heat curable encapsulant on the chip;
   c) synchronizing a firing of a laser pulse immediately after the dispensing step (b) to irradiate a side of said chip remote from said encapsulant to heat said chip; and
   d) curing the dispensed encapsulant solely by allowing heat generated by the laser pulse to flow through the chip and heat the encapsulant,
   the laser pulse heating the chip sufficiently quickly and heat flow through the chip being sufficiently rapid that the encapsulant gels during the heat curing step (d) before it can spill over the chip or wick along chip leads.

2. A method according to claim 1, wherein step (a) comprises positioning the chip in a tape automated bonding process.

3. A method according to claim 1, wherein step (b) comprises uniformly dispensing an epoxy over the chip.

4. A method according to claim 1, wherein step (c) comprises firing a laser pulse from between 0.5 to 3 seconds after the dispensing step (b).

5. A method according to claim 4, wherein step (c) comprises firing a neodymium-ythrium aluminum garnet laser operating in a CW mode.

6. A method according to claim 1, wherein step (d) comprises conducting heat through a back side of the chip.

7. A method according to claim 1, wherein step (c) comprises delivering the laser pulse to the chip by directing the laser pulse through an optical fiber.

8. A method according to claim 1 wherein the chip is less than 2 mm in size along each edge.

* * * * *